(12) United States Patent
Oowaki

(10) Patent No.: US 7,558,078 B2
(45) Date of Patent: Jul. 7, 2009

(54) INFORMATION PROCESSING EQUIPMENT

(75) Inventor: Yoshio Oowaki, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 119 days.

(21) Appl. No.: 11/852,406

(22) Filed: Sep. 10, 2007

(65) Prior Publication Data

US 2008/0062658 A1    Mar. 13, 2008

(30) Foreign Application Priority Data

Sep. 11, 2006   (JP) .............................. 2006-245087

(51) Int. Cl.
*H04B 1/03* (2006.01)
(52) U.S. Cl. .................. 361/814; 361/749; 361/777
(58) Field of Classification Search .................. 361/814, 361/681, 748, 749, 775, 789, 682, 600, 679, 361/760, 777, 779, 751; 439/31, 164, 165, 439/492, 446; 445/550.1, 556.2, 90.3, 575.1; 349/56, 84, 139, 43, 58, 59
See application file for complete search history.

(56) References Cited

U.S. PATENT DOCUMENTS 6,650,547 B2 * 11/2003 Hemmi et al. .............. 361/755
7,001,193 B2 * 2/2006 Zaderej et al. .............. 439/165
7,094,084 B2 * 8/2006 Lee ........................... 439/165
7,248,903 B2 * 7/2007 Yoda ........................ 455/575.1
7,466,558 B2 * 12/2008 Yasuda ........................ 361/755

FOREIGN PATENT DOCUMENTS

JP          05-019896          1/1993

* cited by examiner

*Primary Examiner*—Hung S Bui
(74) *Attorney, Agent, or Firm*—Antonelli, Terry, Stout & Kraus, LLP.

(57) ABSTRACT

According to the invention, information processing equipment using a flexible printed-circuit board which does not lose bendability with repeated opening and closing of a display unit, and which suppresses radiation noise from signal wiring is provided. In the configuration of the invention, a first cover film is formed to cover a wiring layer on a first surface of a base film, and a second cover film is formed to cover a wiring layer on a second surface of the base film. Portions of the second cover film and the underlying wiring layer on the second surface in the loop formation region are discontinuously removed in the inward-bending area of the loop, and the base film is exposed in the removed parts. The wiring layer underneath the remaining second cover film, which is not removed, and the wiring layer on the first surface of the base film are electrically connected via through holes penetrating the base film.

8 Claims, 3 Drawing Sheets

INFORMATION PROCESSING EQUIPMENT

CROSS-REFERENCE TO RELATED APPLICATIONS

The disclosure of Japanese Patent Application No. 2006-245087 filed on Sep. 11, 2006 including the specification, drawings and abstract is incorporated herein by reference in its entirety.

BACKGROUND

1. Field of the Invention

The present invention relates to information processing equipment such as a laptop personal computer equipped with a display device such as a liquid crystal display module in a display unit which can be separated from and joined to a main body unit, and is especially preferable for information processing equipment that transfers signals for display output from an information processing circuit accommodated in the main body unit to the display device with a flexible printed-circuit board.

2. Description of Related Arts

In portable information equipment typified by a laptop personal computer, a display unit and a main body unit are joined with a hinge so as to be openable and closable. Further, in some cases, a flexible printed-circuit board that transfers display signals output from an information processing circuit accommodated in the main body to a display device provided in the display unit becomes a loop around the hinge part for absorbing expansion and contraction due to opening and closing operation of the hinge.

FIG. 1 is a schematic view for explanation of a mounting structure of a flexible printed-circuit board in a laptop personal computer having a display unit and a main body unit joined with a hinge as an example. In the main body unit MBD, a printed-circuit board (also referred to as a mother board) PCB on which an information processing circuit containing a CPU has been mounted is accommodated. Further, the illustration of a keyboard for operation or the like is omitted. Here, the display device described will be a liquid crystal display module MDL; however, the same applies for other display devices such as an organic electroluminescent display panel.

In the display unit DSP, the liquid crystal display module MDL is provided, and is coupled to the main body unit MBD so as to be openable and closable, moving along the direction of the arrow A about a hinge part HNG. Various types of signals for display sent from the information processing circuit of the main body unit MBD to the liquid crystal display module MDL are transferred with a flexible printed-circuit board FPC connecting one edge of the flexible printed-circuit board to a connecter TMN of the printed-circuit board PCB.

FIG. 2 is a schematic view for explanation of only the liquid crystal display module MDL in FIG. 1. Further, FIGS. 3A and 3B are schematic views of connection of a configuration example of the flexible printed-circuit board. FIG. 3A is a sectional view and FIG. 3B is a plan view in the direction of the arrow A of FIG. 3A. The configured example is a conventional example disclosed in Japanese Patent Laid-open Hei 05-19896, and the flexible printed-circuit board FPC is wound in a spiral configuration around the hinge part HNG to absorb the expansion, contraction, and bending of board wiring due to opening and closing of the liquid crystal display module MDL. Although the loop LOP is shown with one turn in FIG. 2 for simplicity of description, a loop with multiple turns is disclosed in Hei 05-19896.

The flexible printed-circuit board FPC has a configuration containing at least the loop LOP formation region, i.e., a curved part as shown in FIGS. 3A and 3B. The flexible printed-circuit board FPC has a conductor layer WL that has plural signal wirings and ground lines on both sides of a base film BF. A first cover film CV1 is stacked on the whole of one surface and a second cover film CV2 is stacked on the other surface, and the second cover film CV2 and the conductor layer constituting the ground lines are removed at least in the loop LOP formation region. On both sides of the base film BF in FIGS. 3A and 3B, portions of the conductor layers WL serving as ground lines are electrically connected with the rest of the conductor layer WL through holes at both ends of the flexible printed-circuit board FPC, which constitute terminals.

SUMMARY

As shown in FIG. 3B, the second cover film CV2 is removed and the conductor layer WL is only on the one side of the base film BF in the loop LOP formation region. Accordingly, radiation noise generated from the conductor material of the signal wires increases. Further, since the entire length becomes longer due to the loop configuration, this also causes increase in radiation noise.

A purpose of the invention is to provide information processing equipment using a flexible printed-circuit board without loss in bendability during opening and closing of a display unit but with suppressed radiation noise from signal wirings.

A feature of the invention for achieving the above purpose is that on the surface other than the above mentioned first surface, where portions of the second cover film in the loop formation region has been removed, a pattern of plural discontinuous portions of conductor layers independent from each other in the inward-bending area is provided under the surface of the cover film portions, and the pattern of these conductor layers is electrically connected to conductor layers that configure the ground lines on the first surface of the base film through holes penetrating the cover film.

The description of a representative means of the invention is as below. That is, the information processing equipment of the invention has a configuration in which a display unit having a display device and a main body unit accommodating an information processing circuit are joined so as to be openable and closable about a hinge, around the hinge part, the flexible printed-circuit board transferring display signals output from the information processing circuit to the display device is a loop, for absorbing expansion and contraction due to opening and closing of the display unit.

Further, the flexible printed-circuit board has a base film, wiring layers on a first surface and a second surface of the base film, and a first cover film covering the wiring layer on the first surface and a second cover film covering the wiring layer on the second surface. Portions of the second cover film and its underlying wiring layer on the first surface of the base film in the region where the loop is formed are discontinuously removed in the inward-bending area of the loop, and the remaining portions of wiring layer which are not removed and the wiring layer on the first surface of the base film are electrically connected via through holes penetrating the base film.

Furthermore, according to the invention, the longitudinal direction of the portions of the wiring layer and the base film which have been removed is perpendicular or diagonal relative to the longitudinal direction of the flexible printed-circuit board, and thereby, adapts to absorb the stress due to the expansions and contractions which differ with each turn of the loop.

Moreover, according to the invention, the stress due to bending is dispersed by varying the intervals between the remaining portions of wiring layer and base film in the inward-bending area of the loop according to the size of the curves of the loop.

In addition, according to the invention, the second surface of the base film may be disposed outside or inside of the loop.

According to the invention, information processing equipment using a flexible printed-circuit board in which does not lose bendability with opening and closing of a display unit and which suppresses radiation noise from signal wirings can be provided.

DETAILED DESCRIPTION OF THE INVENTION

Hereinafter, the best mode of the invention will be described using embodiments.

Embodiment 1

Figure 4A:
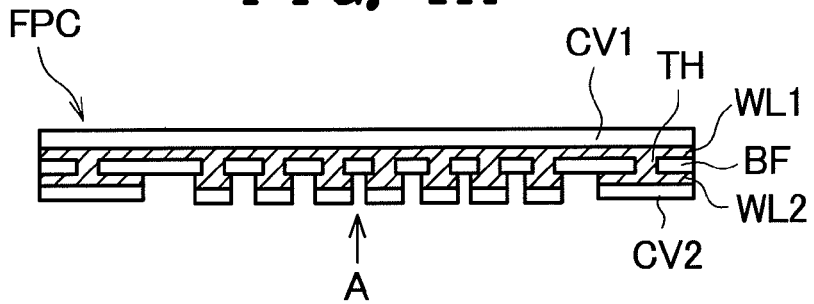
FIGS. 4A and 4B are schematic views showing a configuration of a flexible printed-circuit board for explanation of embodiment 1 of information processing equipment according to the invention.
Figure 4B:
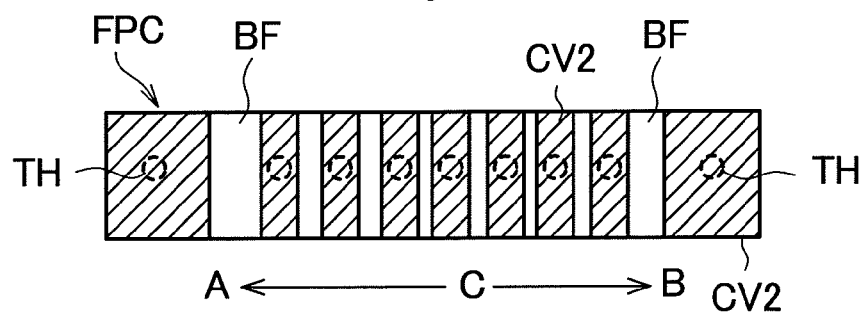

FIGS. 4A and 4B are schematic views showing a configuration of a flexible printed-circuit board for explanation of embodiment 1 of information processing equipment according to the invention. FIG. 4A is a sectional view and FIG. 4B is a plan view of FIG. 4A seen from the direction of the arrow A. This flexible printed-circuit board FPC has a base film BF, and wiring layers WL1, WL2 on a first surface and a second surface of the base film BF, respectively.

A first cover film CV1 is formed to cover the wiring layer WL1 on the first surface of the base film BF. A second cover film CV2 is formed to cover the wiring layer WL2 on the second surface of the base film BF. Further, portions of the second cover film CV2 and the underlying wiring layer WL2 on the second surface of the base film BF in the loop formation region (A-B) are discontinuously removed in the inward-bending area of the loop (the longitudinal direction of the flexible printed-circuit board FPC). The base film BF is exposed in parts where the second cover film CV2 and the underlying wiring layer WL2 on the second surface of the base film BF have been removed.

The wiring layer WL2 underneath the remaining second cover film CV2, which is not removed, and the wiring layer W1 on the first surface of the base film BF are electrically connected via through holes TH penetrating the base film BF.

In embodiment 1, the longitudinal direction of the part where the second cover film CV2 and the wiring layer WL2 on the second surface have been removed is provided to be perpendicular to the longitudinal direction of the flexible printed-circuit board FPC. The intervals between the parts where the second cover film CV2 and the wiring layer WL2 on the second surface have been removed, that is, the widths of the remaining portions of second cover film CV2 and wiring layer WL2 on the second surface may be made equal, or varied in the following manner.

Here, given that the loop region is A-B and the central part is C, the intervals between the remaining portions of second cover film CV2 and the wiring layer WL2 on the second surface in the inward-bending area are gradually increased from C toward A in the A-C region, and gradually increased from C toward B in the B-C region. This addresses the case where the curves of the loop are larger (the amount of bending is larger) in the vicinity of A and the vicinity of B. Alternatively, instead of the intervals, the widths of the remaining portions of second cover film CV2 and wiring layer WL2 on the second surface may be varied in the same manner. Further, the combination of changing intervals and widths may be adopted.

Thus, in embodiment 1, the stress due to bending can be efficiently dispersed by varying the intervals in the inward-bending area of the loop between the remaining portions of wiring layer and base film or the widths of the remaining portions of wiring layer and base film according to the size of the curves of the loop.

Further, the second surface of the base film may be disposed on the outer side or inner side of the loop.

In embodiment 1, the conductor layer which is electrically connected via the through holes TH are used as the ground lines, and thereby, noise radiation can be suppressed. The configuration in which the cover film CV2 remains has been described in the embodiment, however, the cover film CV2 is not essential in the embodiment and may be eliminated.

Embodiment 2

Figure 5:
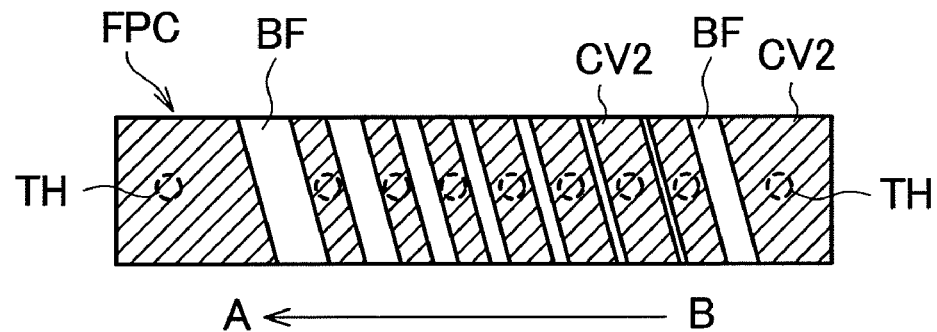
FIG. 5 is a schematic view showing a configuration of a flexible printed-circuit board for explanation of embodiment 2 of information processing equipment according to the invention.

FIG. 5 is a schematic view showing a configuration of a flexible printed-circuit board for explanation of embodiment 2 of information processing equipment according to the invention. FIG. 5 is a plan view like FIG. 4B. In embodiment 2, the longitudinal direction of the portions where the second cover film CV2 and the wiring layer WL2 on the second surface have been removed is provided to be diagonal relative to the longitudinal direction of the flexible printed-circuit board FPC. The intervals between the portions where the second cover film CV2 and the wiring layer WL2 on the second surface have been removed, that is, the widths of the remaining portions of second cover film CV2 and wiring layer WL2 on the second surface may be made equal, or varied in the following manner.

That is, given that the loop region is A-B, the intervals between the remaining portions of the second cover film CV2 and the wiring layer WL2 on the second surface in the inward-bending area are gradually increased from B toward A. This addresses the case where the curves of the loop are larger (the amount of is larger) in the vicinity of the A region. Alternatively, instead of the intervals, the widths of the remaining portions of second cover film CV2 and wiring layer WL2 may be varied in the same manner. Further, a combination of changing the intervals and the widths may be adopted.

Thus configured, embodiment 2 is effective in the case where the end of the loop is shifted toward the central axis of the loop. Further, the stress due to bending can be efficiently dispersed by varying the intervals between the remaining portions of wiring layer and base film in the inward-bending area of the loop or varying the widths of the remaining portions of wiring layer and base film, according to the size of the curves of the loop.

Further, also in embodiment 2, the second surface of the base film may be disposed on the outer side or the inner side of the loop.

Also in embodiment 2, the conductor layers electrically connected via the through holes TH are used as the ground lines, and thereby, noise radiation can be suppressed.

Figure 1:
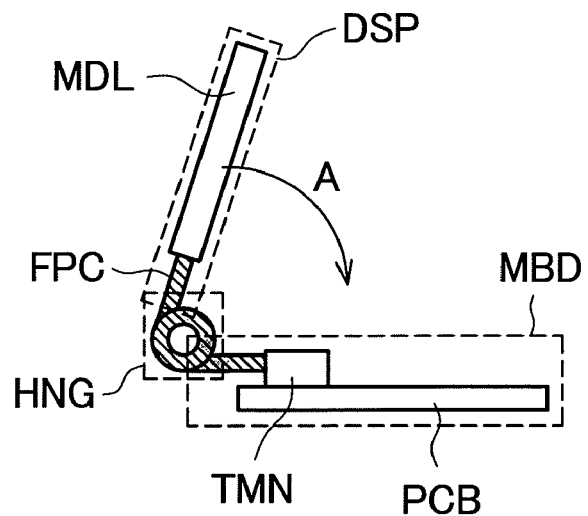
FIG. 1 is a schematic view for explanation of a mounting structure of a flexible printed-circuit board in a laptop personal computer having a display unit and a main body unit joined with a hinge as an example.
Figure 2:
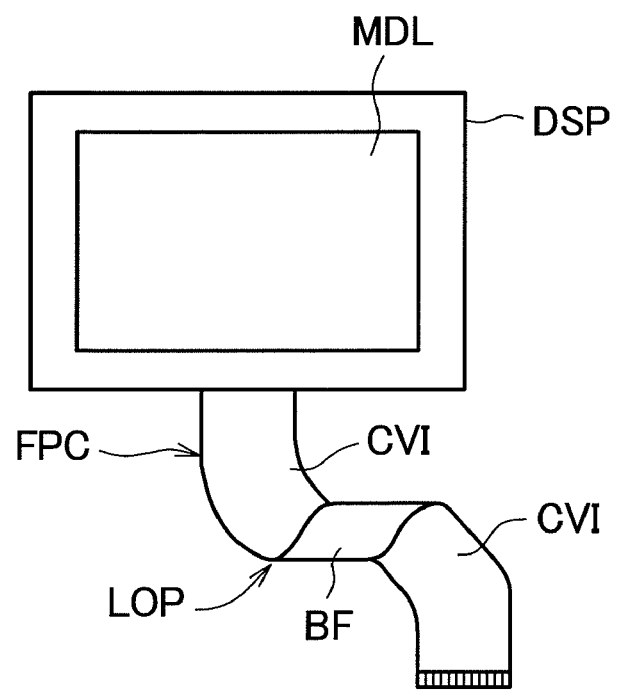
FIG. 2 is a schematic view for explanation only of the liquid crystal display module MDL in FIG. 1.
Figure 3A:
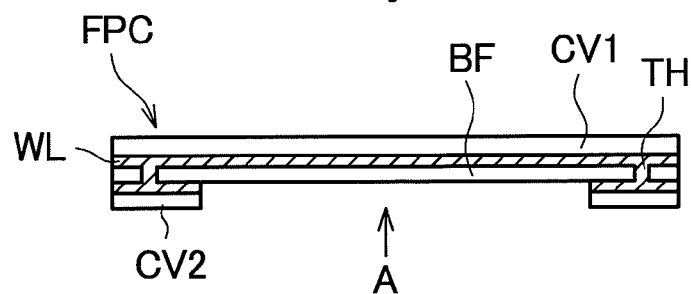
FIGS. 3A and 3B are schematic views of connection of a configuration example of the flexible printed-circuit board.
Figure 3B:
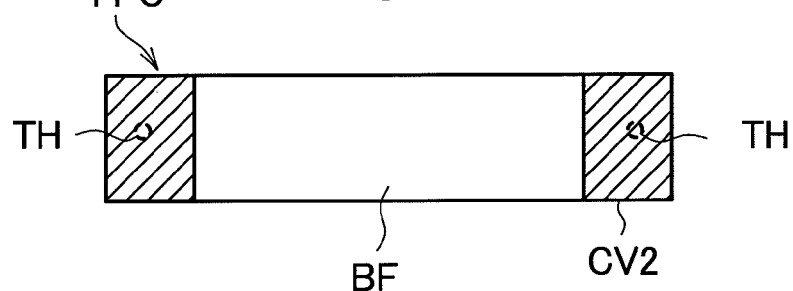
Figure 6:
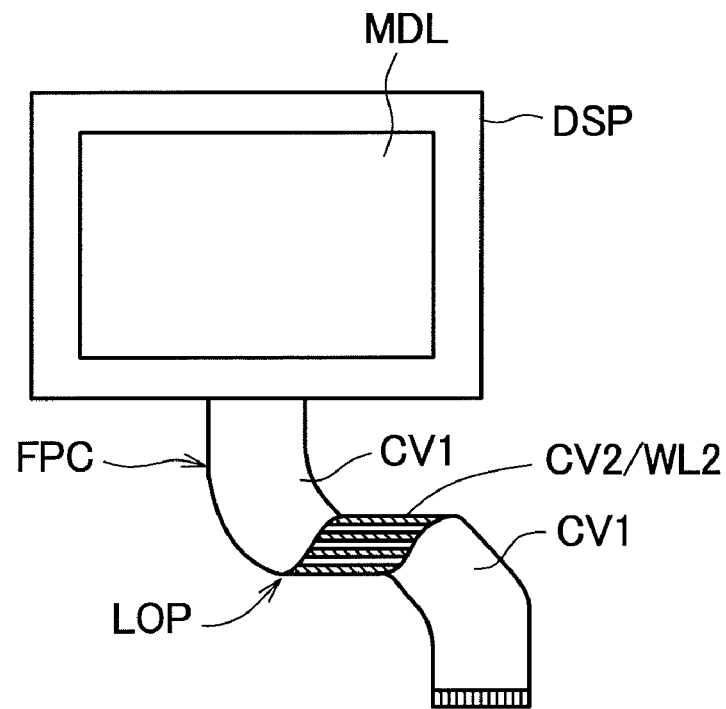
FIG. 6 is a schematic view for explanation only of a liquid crystal display module MDL using the flexible printed-circuit board that has been described in embodiment 1 or embodiment 2 of the invention.

FIG. 6 is a schematic view for explanation only of a liquid crystal display module MDL using the flexible printed-circuit board FPC that has been described in embodiment 1 or embodiment 2 of the invention. The same reference signs as in FIG. 2 correspond to the drawing and the same functional parts. Since the remaining portions of second cover film CV2 and second conductor layer WL2 connected to the ground of the flexible printed-circuit board FPC are in the loop LOP part, the noise radiation is suppressed.

The invention claimed is:

1. Information processing equipment comprising:
   a display unit having a display device and a main body unit accommodating an information processing circuit, joined so as to be openable and closable about a hinge; and
   a flexible printed-circuit board which transfers display signals output from the information processing circuit to the display device and which is a loop around the hinge for absorbing expansion and contraction due to opening and closing operation of the display unit,
   wherein the flexible printed-circuit board has a base film, wiring layers both on a first surface and a second surface of the base film, and a first cover film covering the wiring layer on the first surface,
   portions of the wiring layer on the second surface in a formation region of the loop are discontinuously removed in the inward-bending area of the loop, and
   the remaining portions of the wiring layer which are not removed and the wiring layer on the first surface of the base film are electrically connected via through holes penetrating the base film.

2. The information processing equipment according to claim 1, wherein the longitudinal direction of the portions where the wiring layer and the base film have been removed is perpendicular to the longitudinal direction of the flexible printed-circuit board.

3. The information processing equipment according to claim 2, wherein the intervals between the remaining portions of wiring layer and base film in the inward-bending area of the loop vary according to the size of the curves of the loop.

4. The information processing equipment according to claim 2, wherein the second surface is disposed on the outer side of the loop.

5. The information processing equipment according to claim 2, wherein the second surface is disposed on the inner side of the loop.

6. The information processing equipment according to claim 1, wherein the longitudinal direction of the portions where the wiring layer and the base film have been removed are diagonal relative to the longitudinal direction of the flexible printed-circuit board.

7. The information processing equipment according to claim 1, wherein the wirings electrically connected via the through holes are ground lines.

8. The information processing equipment according to claim 1, wherein the wiring layer on the second surface is covered by a second cover film.

* * * * *